United States Patent [19]

Claydon

[11] Patent Number: 4,578,818
[45] Date of Patent: Mar. 25, 1986

[54] SYSTEM FOR PROCESSING AUDIO FREQUENCY INFORMATION FOR FREQUENCY MODULATION

[75] Inventor: Martin Claydon, Cambridge, England

[73] Assignee: U.S. Philips Corporation, New York, N.Y.

[21] Appl. No.: 728,154

[22] Filed: Apr. 30, 1985

Related U.S. Application Data

[63] Continuation of Ser. No. 471,623, Mar. 3, 1983, abandoned.

[30] Foreign Application Priority Data

Mar. 17, 1982 [GB] United Kingdom ............... 8207713

[51] Int. Cl.$^4$ ............................................. H04B 1/04
[52] U.S. Cl. ................................... 455/110; 307/555; 328/169; 332/18; 381/94
[58] Field of Search ............................ 455/110, 42, 43; 328/169, 173; 307/555, 540; 332/18; 381/94, 104, 120

[56] References Cited

U.S. PATENT DOCUMENTS 4,110,692 8/1978 Pradal .................................. 455/110

FOREIGN PATENT DOCUMENTS 8204365 12/1982 World Int. Prop. O. .......... 455/110

OTHER PUBLICATIONS

"Combining High Signal Quality With High Modulation Levels in FM."–Eric Small et al, Orban/Broadcast, Orban Associates, San Francisco, Calif.; Broadcast Management/Engineering, Oct. 1975, p. 44.

Primary Examiner—Marc E. Bookbinder
Attorney, Agent, or Firm—Joseph P. Abate

[57] ABSTRACT

In FM transmitters, particularly land mobile FM transmitters, wherein a speech signal is pre-emphasized between 300 Hz and 3 kHz, whereafter it is filtered to provide a sharp cut-off and wherein the maximum peak frequency deviation is limited in order to maintain channel integrity, the level of undistorted speech can be raised to within 90% of the transmitter peak deviation by directly connecting an amplitude limiter to a filter amplifier which behaves as a level sensitive filter when the speech signal has been limited and prevents ringing and overshoot from occurring. The output from the filter amplifier is coupled to a low pass filter, typically a fourth-order Butterworth filter, via an attenuator which reduces the amplitude of the signal to prevent the onset of further clipping.

7 Claims, 7 Drawing Figures

SYSTEM FOR PROCESSING AUDIO FREQUENCY INFORMATION FOR FREQUENCY MODULATION

This is a continuation of application Ser. No. 471,623, filed Mar. 3, 1983 now abandoned.

BACKGROUND OF THE INVENTION

The present invention relates to a system for processing audio frequency information, particularly speech, for frequency modulation and to an FM transmitter including said system.

In land mobile FM transmitters, there are mandatory requirements for the frequency response and overload performance of such transmitters. In order to meet these requirements an audio frequency modulating signal is processed so that when it has a relatively low level the transmitter will not have to go through its full modulation capability, but when it has a high level then the response is limited in order to maintain channel integrity. Generally, the frequency response of the transmitted signal has a pre-emphasis characteristic which provides various advantages in terms of noise in the complete transmitter/receiver system. The pre-emphasis characteristic emphasizes the modulating speech signal up to substantially 3 kHz and then there is a filter requirement which means that the level must shut down or roll-off fairly sharply after 3 kHz. FIG. 1 of the accompanying drawings shows three curves 10, 12, 14 representing the pre-emphasis characteristics of modulating signals having low, intermediate and high levels, L, respectively. The horizontal broken line 16 indicates the maximum peak voltage and corresponds to the maximum peak deviation frequency of the transmitter. When comparing the characteristic curves 12 and 14, it is evident that the frequency response of the transmitter has to change as the modulating signal level approaches the maximum peak deviation (denoted by the broken line 16). This change is from a pre-emphasized characteristic, curve 12, to a flat, limiting response such that at no audio frequency is the maximum peak deviation frequency exceeded. The audio signal processing curcuitry has to be arranged so that it passes low and intermediate levels of modulating signals substantially undistorted but clips or limits high levels of modulating signal such that regardless of frequency it does not exceed the maximum peak voltage, the broken line 16 in FIG. 1. The voltage generated by the audio frequency processor corresponds to the instantaneous frequency deviation of the transmitter and the absolute maximum output voltage of the processor corresponds to the peak system deviation the transmitter is capable of producing.

A known audio processing circuit is illustrated in FIG. 2 of the accompanying drawings while FIG. 3 illustrates diagrammatically the frequency characteristic of each stage of the circuit shown in FIG. 2. In FIG. 2, the audio processing circuit comprises a transducer in the form of a microphone 18 which is connected to a pre-emphasis device 20. The output from the device 20 is applied to a clipper circuit 22 which clips the pre-emphasized signal if it exceeds a predetermined level. The output from the clipper circuit 22 is applied to a low-pass filter 23 which has a sharp roll-off above 3 kHz. In order to obtain the desired roll-off characteristic, the low-pass filter 23 comprises a Chebyschev filter 24 whose output is coupled to a Butterworth filter 26. The output from the low-pass filter 23 is derived from a terminal 28 and is used to frequency modulate a transmitter.

Referring to FIG. 3 the frequency characteristics of each part of the circuit in FIG. 2 are shown, and for convenience of identification, each characteristic is referenced with the number of the part of circuit with a suffix A. Thus, the microphone 18 has a characteristic 18A which is substantially flat between 300 Hz and 5 kHz. As shown, the pre-emphasis characteristic 20A increases substantially linearly between 300 Hz and 3 kHz whereas the clipper characteristic 22A is substantially flat over this frequency range and corresponds to the maximum peak voltage (see the broken line 16 in FIG. 1). The characteristic 24A of the Chebyschev filter 24 rises non-linearly between 300 Hz and 3 kHz after which it rolls-off fairly rapidly. In contrast, the characteristic 26A of the Butterworth filter rolls-off steadily between 300 Hz and 3 kHz and more sharply thereafter. The effect of constructing the low-pass filter 23 from the filters 24 and 26 is shown by the overall resultant filter characteristic 23A in FIG. 4 of the accompanying drawings. The resultant characteristic 23A is substantially flat up to 3 kHz and then rolls-off sharply.

The known circuit arrangement of FIG. 2 has a disadvantage that the maximum peak output level for an undistorted signal, for example a sine wave, is typically between 60% and 70% of the high level maximum peak output level. The reasons for this can be understood from a consideration of FIG. 5 of the accompanying drawings. In FIG. 5, the broken line sine wave represents the maximum peak signal which can be processed by the circuit shown in FIG. 2 without being distorted, the output peak amplitude being designated by the letter P. The frequency of this signal is 1 kHz. The waveforms shown in full lines represent a signal level which is sufficiently high that it becomes limited during the audio processing. The input signal is shown in diagram A of FIG. 5. Diagram B is the waveform of the signal after pre-emphasis and clipping. Diagram C shows the waveform at the output of the Chebyschev filter 24. Because the input thereto is a stepped waveform, the rising edge of the waveform produces an overshoot and ringing at the cut-off frequency of the filter, that is at 3 kHz. This waveform is passed substantially unchanged by the Butterworth filter 26, Diagram D. In the frequency modulator the overshoot is treated as the maximum peak output level, designated by the letter Q, which causes the maximum frequency deviation. In most mobile radio equipment, the peak undistorted output (P) is typically between 60% and 70% of the maximum peak output level.

SUMMARY OF THE INVENTION

It is an object of the present invention to increase the level of audio signal that could be produced without clipping distortion, to much nearer the peak output achieved during clipping.

According to the present invention there is provided a processing system for a pre-emphasized audio signal for modulation on an FM transmitter, the system including a limiter amplifier whose output is coupled directly to an input of an amplifier filter having a clipped step response, wherein if the pre-emphasized audio signal is below a certain peak amplitude, then said signal is processed and filtered substantially undistorted, but if the pre-emphasized audio signal exceeds this peak amplitude then said signal is clipped in the limiter amplifier and filtered in the amplifier filter which behaves as a level sensitive filter.

By the amplifier filter behaving as a level sensitive filter in response to a clipped signal, then no overshoot and ringing are produced. In consequence, when compared to the prior art system described, the system in accordance with the present invention permits low distortion (<3%) audio modulation to be achieved to within 90% of the transmitter peak frequency deviation.

In an embodiment of the present invention the limiter amplifier and amplifier filter, respectively, comprise first and second operational amplifiers, wherein the second operational amplifier behaves as a level sensitive filter by saturating the output devices on a supply rail. By using operational amplifiers, the system can be implemented in an inexpensive way.

If desired, the first operational amplifier can be biased by a potentiometer which is adjusted to provide symmetrical clipping of the audio signal.

Another filter may be coupled to the output of the amplifier filter in order to prevent what is termed sideband splatter from harmonics generated by the clipped signal. An attenuator may be connected between the amplifier filter and the another filter to reduce the amplitude of the signal and thereby avoid further clipping in the another filter.

In implementing the system in accordance with the present invention, the amplifier filter comprises a filter which behaves as a Chebyschev filter below the clipping level and the another filter comprises at least a third-order Butterworth filter.

The present invention also relates to an FM transmitter including an audio signal processing system in accordance with the present invention.

DESCRIPTION OF THE DRAWINGS

The present invention will now be described, by way of example, with reference to the Figures of the accompanying drawings, wherein.

DESCRIPTION OF THE PREFERRED EMBODIMENT

Figure 6:
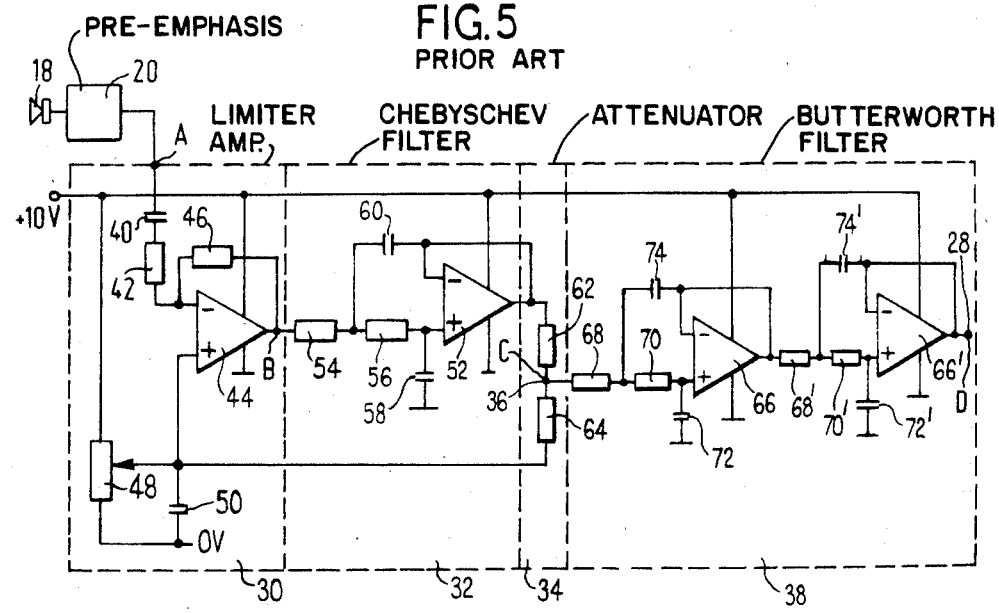
FIG. 6 is a part block schematic and part schematic circuit of a system for processing audio information.

In FIG. 6 the audio signal from a microphone 18 is applied to a pre-emphasis device 20. The output from device 20 is supplied to a limiter amplifier 30 which performs the functions of providing additional microphone gain and acting as a level clipper, preferably a symmetrical clipper. The limiter amplifier 30 output is directly coupled to a Chebyschev filter 32. An attenuator 34 is connected to the output of the Chebyschev filter 32. An output from a tap 36 of the attenuator 34 is coupled directly to a fourth-order Butterworth filter 38 which in the illustrated circuit comprises two second-order Butterworth filters. The output of the Chebyschev filter is also connected back to the non-inverting input of the limiter amplifier 30 via the attenuator 34.

In implementing the circuit shown in FIG. 6, it is convenient to use operational amplifiers (op-amps) from the LS 204 family which are available in quad packages. In the limiter amplifier 30, the audio signal is coupled via a capacitor 40 in series with a resistor 42 to the inverting input of an op-amp 44. A feedback resistor 46 is connected between the output of the op-amp 44 and its inverting input. A bias voltage is applied to the non-inverting input of the op-amp 44. The bias voltage may advantageously be derived from a tapping of a potentiometer 48 which is adjusted to provide symmetrical clipping. The gain of the op-amp 44 below clipping is determined by the ratio of the resistance of the feedback resistor 46 and that of the input resistor 42. Clipping occurs when the output voltage swing becomes large enough to saturate op-amp 44 output devices and a typical figure would be 8 volts peak-to-peak with supply rails of 0 V and +10 V, i.e. the peak-to-peak voltage in clipping equals $(10-V_{sat})$ volts, where $V_{sat}$ equals the sum of the saturation voltages of the output devices of the op-amp 44. A decoupling capacitor 50 is connected to the non-inverting input of the op-amp 44 and the 0 V rail.

The Chebyschev filter 32 is a second-order filter of conventional design comprising an op-amp 52 whose non-inverting input is connected to the output of the limiter amplifier 30 by series connected resistors 54, 56 of equal resistance value R. A capacitor 58 is connected between the non-inverting input of the op-amp 52 and the 0 V rail. The output of the op-amp 52 is fed back to its inverting input which is connected by another capacitor 60 to the junction of the series connected resistors 54, 56. The capacitance values C58 and C60 of the capacitors 58, 60, respectively, can be determined by the following equations:

$$C58 = \xi/R\omega_c \text{ and}$$

$$C60 = 1/R\xi\omega_c \text{ where}$$

$\omega_c = 2\pi \times$ (cut-off frequency i.e. 3 kHz)

$\xi$ is the damping factor and equals $\sqrt{C58/C60}$ which for a Chebyschev filter is less than $\sqrt{2}/2$ and equals approximately 0.35 for this application.

The maximum output voltage swing equals $(10-V_{sat})$ volts. The filter has unity pass band gain at very low frequencies.

The output of the Chebyschev filter 32 is applied to one end of the attenuator 34 comprising two fixed resistors 62, 64 connected in series, the junction of the resistors forms the tap 36 of the attenuator 34. The other (lower) end of the attenuator 34 is at the bias voltage of the non-inverting input of the op-amp 44 which voltage in this embodiment is derived from the tap of the potentiometer 48. Alternatively, the other end of the attenuator 34 and the non-inverting input of the op-amp 44 can be biased independently.

The two second-order Butterworth filters constituting the fourth-order Butterworth filter 38 comprise two identical stages and, for convenience of description, only one of the stages of the Butterworth filter will be described and corresponding primed reference numerals will apply to the same components of the other stage.

The Butterworth filter stage comprises an op-amp 66 whose non-inverting input is connected to the tap 36 of the attenuator 34 by way of two series connected resistors 68, 70 of equal resistance value R'. The non-inverting input of the op-amp 66 is connected by a capacitor 72 to the 0 V rail. The output of the op-amp 66 is fed back to its inverting input which is connected by a capacitor 74 to the junction of the series connected resistors 68, 70. The capacitance C74 of the capacitor 74 is twice that of the capacitance C72 of the capacitor 72, that is C74=2×C72. The damping factor $\xi=\sqrt{C72/C74}=\sqrt{2}/2$ and C72=0.707/R'$\omega_c$ where $\omega_c=2\pi\times$cut-off frequency.

The output from the op-amp 66' is connected via the terminal 28 to an FM transmitter stage, known per se, with a carrier frequency of 100 MHz.

Figure 7:
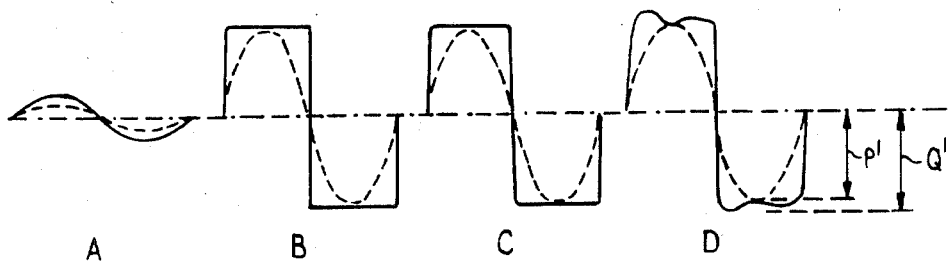
FIG. 7 is a series of waveforms which serve to illustrate the operation of the circuit shown in FIG. 6.

The operation of the circuit shown in FIG. 6 will now be described with the aid of the waveforms shown in FIG. 7 wherein waveforms A and B are, respectively, the input to and output of the limiter amplifier 30, waveform C is the output of op-amp 52 and waveform D is the output of op-amp 66'.

Figure 1:
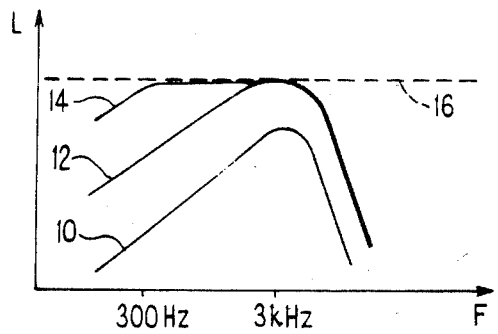
FIG. 1 shows the pre-emphasis curves for various modulating signal levels.
Figure 2:
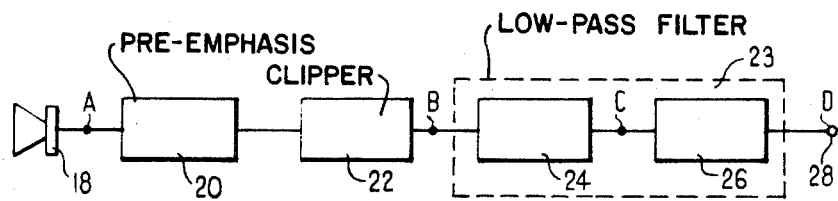
FIG. 2 is a block schematic circuit of a prior art system for processing audio information.
Figure 3:
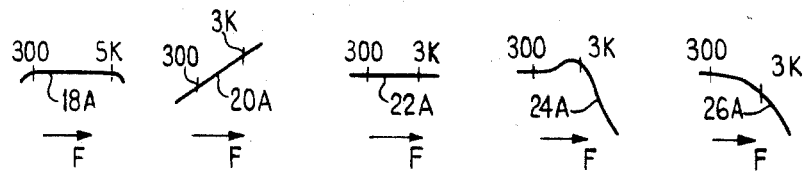
FIG. 3 is a series of waveforms, illustrating the frequency characteristics of the circuit of FIG. 2.
Figure 4:
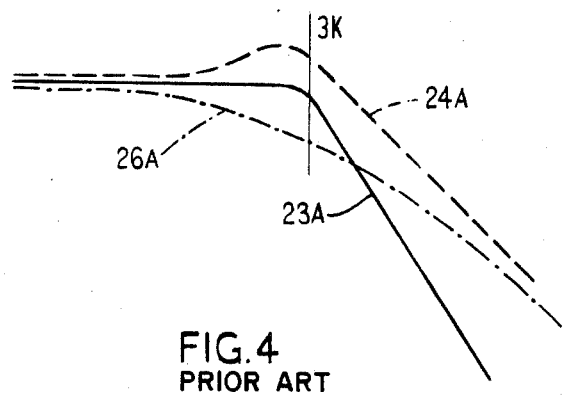
FIG. 4 is the resultant frequency characteristic of the filter in the circuit of FIG. 2.
Figure 5:
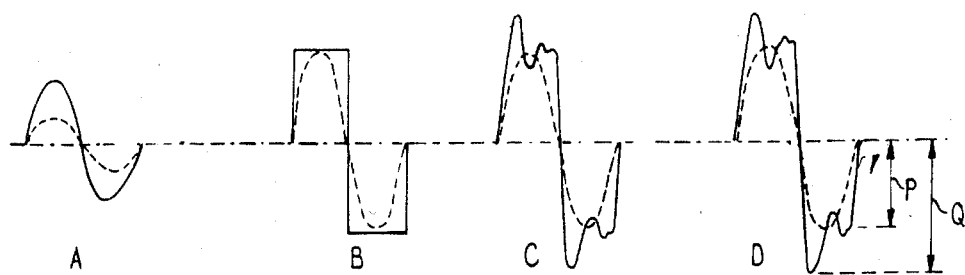
FIG. 5 is a series of waveforms which serve to illustrate the operation of the circuit of FIG. 2.

The DC coupling of the limiter amplifier 30 to the Chebyschev filter 32 produces a useful effect which enables the audio processing circuit to pass a higher level of undistorted signal compared to the circuit shown in FIG. 2. At levels below clipping, the operation of the circuit is normal as is illustrated by the 1 kHz sine waves shown in broken lines in diagrams A to D. However, when the signal level is high enough for clipping to occur, diagram B, the step response of the Chebyschev filter 32 is dramatically abbreviated by the onset of clipping in its own op-amp 52. In consequence, the filter 32 behaves as a level sensitive filter which responds as a normal Chebschev filter below clipping and has a zero overshoot approximation to a first-order (higher cut-off frequency) filter above the onset of clipping.

In fact, the Chebyschev filter 32 in the clipping situation is not working as a proper filter because there is no feedback so its operation has changed from the non-clipping situation to the clipping one. For both the op-amps 44 and 52 the limiting mechanism is via saturation of the output devices on the supply rail; e.g. each op-amp is actually driven into clipping on its own supply rail, thus the possibility of overshoot is avoided.

The fourth-order Butterworth filter 38 is provided in order to meet the adjacent channel sideband specification which is measured with a high level signal. The resistive attenuator 34 is provided to prevent the onset of further clipping in the Butterworth filter 38. At the output of the op-amp 66', diagram D, there has been a slight overshoot in response to the clipped signal but the effect is much diminished compared to the output from the circuit shown in FIG. 2. In FIG. 7 the broken line sine wave in diagram A has an amplitude just below the clipping level and the full line sine wave is +12 db greater in amplitude than the broken line one. At the output of the op-amp 66' the peak amplitude P' of the undistorted sine wave is 90% of the maximum peak output level Q'. In consequence, incorporating the audio processing circuit of the type shown in FIG. 6 into the audio processor section of an FM land mobile transmitter, permits low distortion, <3%, audio modulation to be achieved to within 90% of the transmitter peak frequency deviation. Thus the necessary mandatory filtering is obtained without the destructive step response of existing systems.

I claim:

1. A processing system for a pre-emphasized audio signal for modulation on an FM transmitter, the system comprising:
   a limiter amplifier including a first operational amplifier having a non-inverting input and having an output;
   an amplifier filter including a second operational amplifier having an input, the input of the second operational amplifier being connected to the output of the first operational amplifier, the second operational amplifier being connected to a voltage supply rail, the limiter amplifier and the amplifier filter having responses such that when a pre-emphasized audio signal applied to the limiter amplifier is below a certain peak amplitude the pre-emphasized audio signal passes substantially undistorted through both the limiter amplifier and the amplifier filter and such that when the pre-emphasized audio signal exceeds the peak amplitude the pre-emphasized audio signal is clipped in the limiter amplifier and filtered in the amplifier filter;
   means for providing a bias voltage to the non-inverting input of the first operational amplifier, the bias voltage being such that the pre-emphasized audio signal is symmetrically clipped in the limiter amplifier, and
   an attenuator connected to an output of the second operational amplifier and to the non-inverting input of the first operational amplifier.

2. An FM transmitter including an audio signal processing system as claimed in claim 1 coupled to an FM modulator.

3. A processing system as claimed in claim 1 wherein the amplifier filter acts as a second-order Chebyschev filter for signals below the certain peak amplitude.

4. A processing system for a pre-emphasized audio signal for modulation on an FM transmitter, the system comprising:
   a limiter amplifier including a first operational amplifier having a non-inverting input and having an output;
   an amplifier filter including a second operational amplifier having an input, the input of the second operational amplifier being connected to the output of the first operational amplifier, the limiter amplifier and the amplifier filter having responses such that when a pre-emphasized audio signal applied to the limiter amplifier is below a certain peak amplitude the pre-emphasized audio signal passes substantially undistorted through both the limiter amplifier and the amplifier filter and such that when the pre-emphasized audio signal exceeds the peak amplitude the pre-emphasized audio signal is clipped in the limiter amplifier and filtered in the amplifier filter;
   means for providing a bias voltage to the non-inverting input of the first operational amplifier, the bias voltage being such that the pre-emphasized audio signal is symmetrically clipped in the limiter amplifier, and
   another filter coupled to an output of the second operational amplifier, the another filter being at least a third-order Butterworth filter.

5. An FM transmitter including an audio signal processing system as claimed in claim 4 coupled to an FM modulator.

6. A processing system as claimed in claim 1 wherein the bias voltage providing means includes a potentiometer having a tap connected to the non-inverting input of the first operational amplifier.

7. A processing system as claimed in claim 4 wherein the amplifier filter acts as a second-order Chebyschev filter for signals below the certain peak amplitude.

* * * * *